(12) United States Patent
Kirscht et al.

(10) Patent No.: US 7,651,566 B2
(45) Date of Patent: Jan. 26, 2010

(54) METHOD AND SYSTEM FOR CONTROLLING RESISTIVITY IN INGOTS MADE OF COMPENSATED FEEDSTOCK SILICON

(76) Inventors: Fritz Kirscht, Wernitzer Strasse 36, 12621 Berlin (DE); Vera Abrosimova, Bahrenforfer Str. 13, 12555 Berlin (DE); Matthias Heuer, Scharnhorststrasse 53, 04275 Leipzig (DE); Dieter Linke, Alt-Schmoeckwitz 5, 12527 Berlin (DE); Jean Patrice Rakotoniana, Richterstr. 09, 12456 Berlin (DE); Kamel Ounadjela, 116 Clipper Dr., Belmont, CA (US) 94002

( * ) Notice: Subject to any disclaimer, the term of this patent is extended or adjusted under 35 U.S.C. 154(b) by 222 days.

(21) Appl. No.: 11/769,109

(22) Filed: Jun. 27, 2007

(65) Prior Publication Data

US 2009/0026423 A1   Jan. 29, 2009

(51) Int. Cl.
C30B 15/00 (2006.01)
(52) U.S. Cl. .............................. 117/13; 117/11; 423/324
(58) Field of Classification Search ............. 117/3, 117/11, 13; 423/324; 164/338.1; 438/488
See application file for complete search history.

(56) References Cited

U.S. PATENT DOCUMENTS

2005/0207960 A1   9/2005   Saito

2007/0128099 A1   6/2007   Enebakk et al.

FOREIGN PATENT DOCUMENTS

WO   WO 2007001184 A1   1/2007

*Primary Examiner*—Harold Y. Pyon
*Assistant Examiner*—Haidung D Nguyen
(74) *Attorney, Agent, or Firm*—Hulsey Intellectual Property Lawyers, P.C.

(57) ABSTRACT

Techniques for controlling resistivity in the formation of a silicon ingot from compensated feedstock silicon material prepares a compensated, upgraded metallurgical silicon feedstock for being melted to form a silicon melt. The compensated, upgraded metallurgical silicon feedstock provides a predominantly p-type semiconductor for which the process assesses the concentrations of boron and phosphorus and adds a predetermined amount of aluminum or/and gallium. The process further melts the silicon feedstock together with a predetermined amount of aluminum or/and gallium to form a molten silicon solution from which to perform directional solidification and, by virtue of adding aluminum or/and gallium, maintains the homogeneity the resistivity of the silicon ingot throughout the silicon ingot. In the case of feedstock silicon leading to low resistivity in respective ingots, typically below 0.4 Ωcm, a balanced amount of phosphorus can be optionally added to aluminum or/and gallium. Adding phosphorus becomes mandatory at very low resistivity, typically close to 0.2 Ωcm and slightly below.

17 Claims, 3 Drawing Sheets

METHOD AND SYSTEM FOR CONTROLLING RESISTIVITY IN INGOTS MADE OF COMPENSATED FEEDSTOCK SILICON

FIELD

The present disclosure relates to methods and systems for use in the fabrication of semiconductor materials such as silicon. More particularly, the present disclosure relates to a method and system for controlling resistivity in the formation of p-type silicon ingots that permits the use of low-grade silicon feedstock, for fabricating silicon that may be ultimately useful in the manufacturing of solar cells and similar products.

DESCRIPTION OF THE RELATED ART

The photovoltaic industry (PV) industry is growing rapidly and is responsible for increasing industrial consumption of silicon being consumed beyond the more traditional integrated circuit (IC) applications. Today, the silicon needs of the solar cell industry are starting to compete with the silicon needs of the IC industry. With present manufacturing technologies, both IC and solar cell industries require a refined, purified, silicon feedstock as a starting material.

Materials alternatives for solar cells range from single-crystal, electronic-grade (EG) silicon to relatively dirty, metallurgical-grade (MG) silicon. EG silicon yields solar cells having efficiencies close to the theoretical limit, but at a prohibitive price. On the other hand, MG silicon typically fails to produce working solar cells. Early solar cells using polycrystalline silicon achieved very low efficiencies of approximately 6%. In this context, efficiency is a measure of the fraction of the energy incident upon the cell to that collected and converted into electric current. However, there may be other semiconductor materials that could be useful for solar cell fabrication. In practice, however, nearly 90% of commercial solar cells are made of crystalline silicon.

Because of the high cost and complex processing requirements of obtaining and using highly pure silicon feedstock and the competing demand from the IC industry, silicon needs usable for solar cells are not likely to be satisfied by either EG, MG, or other silicon producers using known processing techniques. As long as this unsatisfactory situation persists, economical solar cells for large-scale electrical energy production may not be attainable.

The resistivity is one of the most important properties of silicon (Si) used for manufacturing solar cells. That is because the solar cell efficiency sensitively depends on the resistivity. State-of-the-art solar cell technologies require resistivity values ranging between 0.5 Ωcm and 5.0 Ωcm, typically.

Besides the resistivity range, the type of conductivity is of utmost importance when making solar cells. Conductivity needs to be either p-type or n-type, i.e., either electrons or holes are the majority current carriers. In current cell technologies, p-type silicon material is typically doped with boron (B), which introduces holes or, expressed differently, acts as an acceptor in respective silicon. Of lesser or even no use are currently cell technologies that apply n-type silicon. Such material is typically doped with phosphorus (P) which introduces electrons. Expressed differently, phosphorus is acting as a donor.

Feedstock silicon materials based on upgraded metallurgical (UM) silicon very often contain similar amounts of B and P. As a consequence, boron induced holes and phosphorus induced electrons can cancel each other, an effect called compensation. The compensation of majority current carriers often leads to a transition from p-type silicon (in the beginning of a crystallization process) to n-type silicon (at the end of a crystallization process). This is a consequence of different segregation behavior of these doping elements: phosphorus has a smaller segregation coefficient than boron. Thereby, in the case of casting ingots for producing multi-crystalline (mc) Si, the process might end up with p-type material only in bottom and middle parts of such ingots whereas the top part becomes n-conductive and has to be discarded.

Currently produced feedstock materials based on UM silicon come often with a base resistivity below the minimum resistivity of 0.5 Ωcm that is typically specified by solar cell manufacturers. There is a simple reason for this: Expensive processes for upgrading UM-Si are primarily concerned with taking out non-metals including dopant atoms B and P. In order to reduce cost, there is a clear tendency to minimize such processing, i.e., UM-Si typically still contains high concentrations of dopant atoms. As long as boron is the dominating dopant we get p-type material with relatively low resistivity.

Compensation of boron by phosphorus—increasing with ongoing crystallization due to different incorporation of B and P at solidification—results in increasing resistivity with ongoing crystallization. So, the typically very low resistivity at the beginning of crystallization is increasing with ongoing crystallization. However, as already stated, there is the general problem of too heavy resistivity increase due to overcompensation of B by P, resulting in a transition of conductivity from p-type to n-type. The addition of boron for suppressing such a transition is not practical because one would even further reduce the resistivity in bottom and middle parts of, e.g., an ingot of mc-Si.

Accordingly, a need exists to control the compensation effect of the material, in order to increase the portion of p-type silicon material in ingots thereby increasing the yield of such material.

SUMMARY

Techniques are here disclosed for providing a combination of interrelated steps at the ingot formation level for ultimately making economically viable the fabrication of solar cells on a mass production level. The present disclosure includes a method and system for forming multi-crystalline silicon ingots, which ingots possess uniformly p-type semiconductor material along essentially all of the ingot axial length. With the disclosed process and system silicon ingots may be formed directly within a silicon melt crucible. For example, using mc-Si ingots formed from the processes here disclosed, solar wafers and solar cells can be made with improved performance/cost ratio, based on this mc-Si material.

According to one aspect of the disclosed subject matter, at semiconductor ingot forming a method and system permit controlling resistivity in the formation of a silicon ingot by preparing UM silicon feedstock for being melted to form a silicon melt. The present disclosure assesses the concentrations of boron and phosphorus in said UM-Si feedstock material. Our approach of choice is analyzing the initial incorporation of B and P in small-size reference ingots made of feedstock material to be improved. Based on this assessment, a predetermined amount of an element of group III of the periodic system, which can be Ga or/and Al, is added to the UM-Si feedstock material before melt-down preceding the crystallization of a large-size ingot. The predetermined quantity of such group III element(s) associates with the assessed B and P concentrations.

The present disclosure includes melting the UM-Si feedstock and the added group III element(s) to form a molten silicon solution including the predetermined amount of group III element(s); performing a directional solidification of the molten silicon solution for forming a silicon ingot and, by virtue of the adding a predetermined amount of the group III element(s), maintaining the homogeneity the resistivity of the silicon ingot throughout the silicon ingot. Below certain resistivity it becomes advantageous adding P to group III element (s) Al or/and Ga. This way the useful resistivity range of reasonably yielding p-type ingots made of compensated UM-Si feedstock can be extended downward to approximately 0.15 Ωcm.

These and other advantages of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following figures and detailed description. It is intended that all such additional systems, methods, features and advantages be included within this description, be within the scope of the accompanying claims.

BRIEF DESCRIPTIONS OF THE DRAWINGS

The features, nature, and advantages of the disclosed subject matter may become more apparent from the detailed description set forth below when taken in conjunction with the drawings in which like reference characters identify correspondingly throughout and wherein:

FIG. 1 demonstrates one aspect of forming a silicon ingot that the present disclosure addresses;

DETAILED DESCRIPTION OF THE SPECIFIC EMBODIMENTS

The method and system of the present disclosure provide a semiconductor ingot formation process for producing a multi-crystalline silicon ingot. As a result of using the disclosed subject matter, an improvement in the properties of low-grade semiconductor materials, such as upgraded, partially purified metallurgical silicon occurs. Such improvement allows, for example, the use of UM-Si in producing solar cells as may be used in solar power generation and related uses. The method and system of the present disclosure, moreover, particularly benefits the formation of solar cells using UM or other non-electronic grade feedstock silicon materials, but can be used for electronic grade feedstock silicon too.

Directional solidification (DS) leads to characteristic axial distribution of impurities (I), controlled by impurity-specific segregation characteristics. The so-called segregation coefficient S that describes segregation characteristics is described by the following simplified expression:

$$S(I) = f(C(I)_{crystal}/C(I)_{melt})$$

where,
$S(I)$ represents the segregation coefficient of a specific impurity like dopant atoms, for example I=B or I=P;
$C(I)_{crystal}$ represents the concentration of, e.g., B or P in the solidified, crystalline silicon; and
$C(B)_{melt}$ represents the concentration of, e.g., B or P in the respective silicon melt.

If both boron and phosphorus are present in feedstock material used for DS crystallization of silicon, from the variation of axial resistivity after crystallization it is possible to conclude on the concentration ratio B/P in respective feedstock silicon material. Conveniently, already a small (e.g. from a charge size of only a few 100 grams feedstock material) ingot or crystal, resp., is sufficient to get reliable axial resistivity profiles, presupposed the feedstock sampling reflects characteristic feedstock composition relative to the concentration of B and P. Most important is the assessment of initial incorporation of B and P in such a small reference ingot. We have applied this methodology for investigating feedstock materials with different B/P ratios.

At B/P ratios close to 2 and below, we have seen a transition from p-conductivity to n-conductivity in respective ingots, leading to yield loss of usable p-type material of at least 10%. Typically, the portion of n-type material and the corresponding yield loss of p-type material can be up to almost 50%. We found methods to significantly improve the distribution of axial resistivity in ingots made from feedstock material with such compensation-related transition of conductivity. Those methods allow to completely suppressing a transition to n-type material so that up to 100% of respective ingots can be used. More typical is a yield of approximately 95% of usable p-type material.

Figure 1:
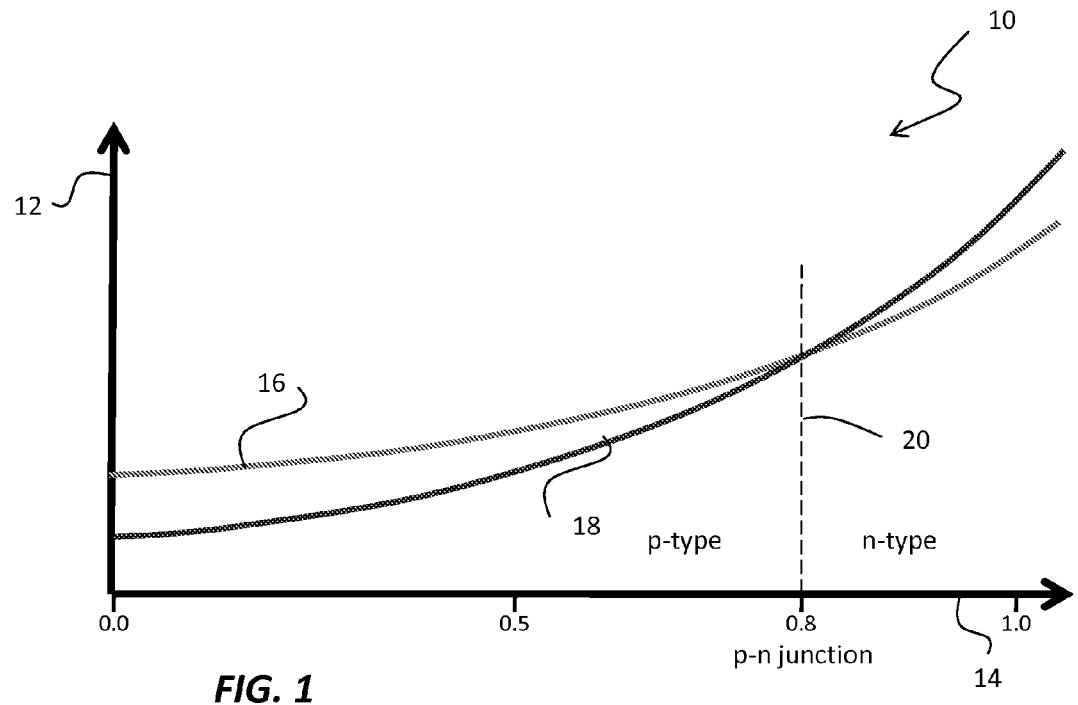

FIG. 1 shows diagram 10 which conceptually portrays the concentration of boron and phosphorus appearing in a silicon feedstock melt for forming a silicon ingot. In diagram 10, ordinate 12 relates to dopant concentration in the silicon melt, while axis 14 represents the stage of silicon ingot formation ranging from 0% (0.0) to 100% (1.0). Line 16 represents the change in boron concentration in the silicon melt, while line 18 represents the change in phosphorus concentration. Initially—close to 0% of ingot formation—B/P ratios >1 might exist.

As conceptual diagram 10 shows, because of the different segregation coefficients of boron and phosphorus, at some point in the silicon ingot formation, the concentration of phosphorus exceeds the concentration of boron. Thus, a silicon melt that began as a p-type semiconductor material will become an n-type semiconductor material. This is shown at line 20. Line 20, therefore, depicts that since the silicon becomes an n-type semiconductor the resulting silicon ingot exhibits a p-n junction.

Figure 2:
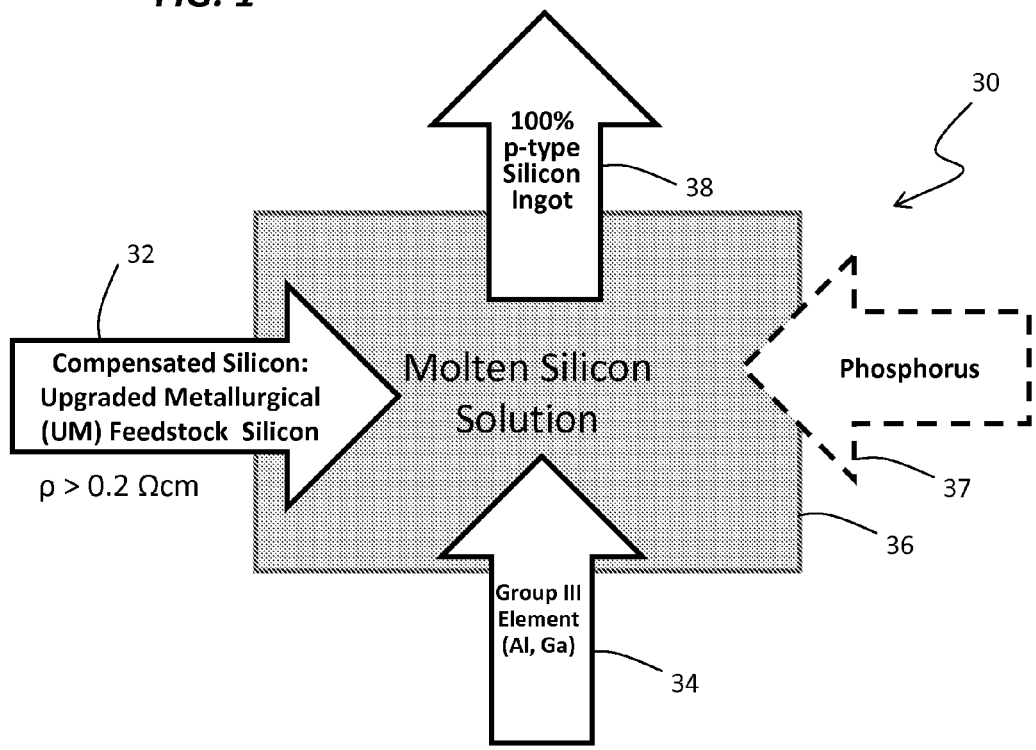
FIG. 2 illustrates conceptually an embodiment of the present disclosure for forming a silicon ingot possessing essentially all p-type silicon material.

FIG. 2 depicts one embodiment of the process 30 of the present disclosure, wherein compensated p-type UM silicon 32 requires a determined amount of a group III element 34, specifically aluminum or gallium, to form molten silicon solution 36. If the initial resistivity, ρ, of UM silicon 32 ranges between 0.15 Ωcm and 0.5 Ωcm, optionally also phosphorus 37 may be added to a group III element of the above kind. Using a silicon ingot formation process, for example a typical casting process, according to the present disclosure such a process yields a 100% p-type silicon ingot 38.

Figure 3:
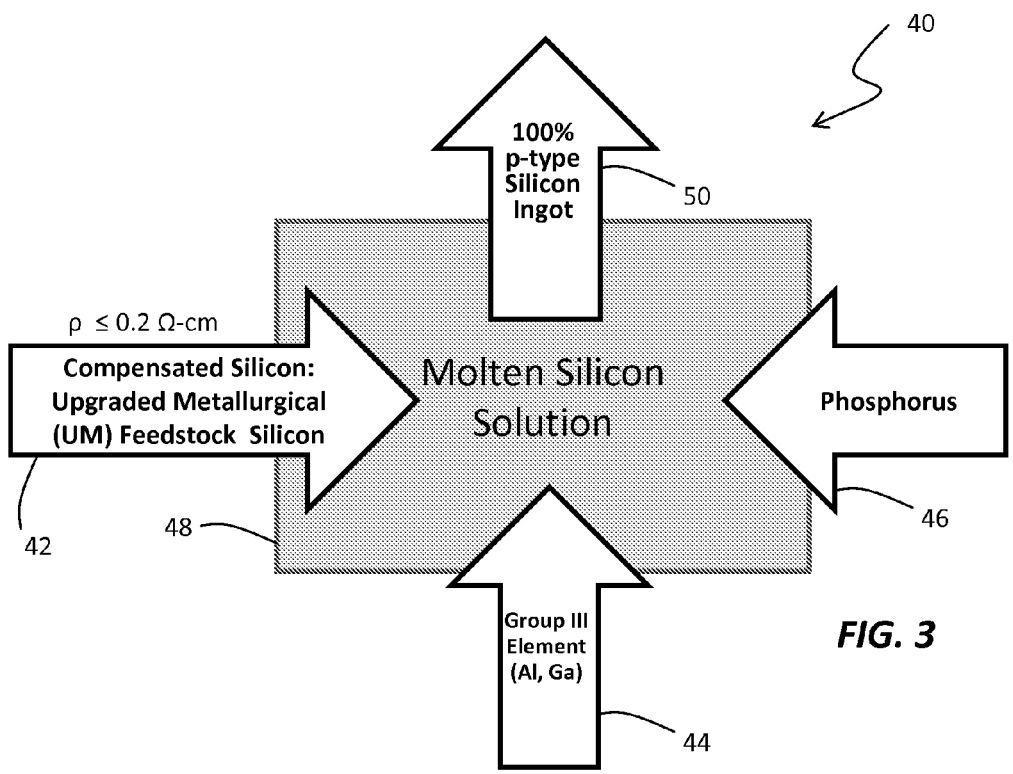
FIG. 3 shows conceptually an alternative embodiment of the present disclosure for forming a silicon ingot possessing essentially all p-type silicon material.

FIG. 3 presents an alternative embodiment of the process 40 of the present disclosure, wherein compensated UM p-type silicon 42 has an initial resistivity close to the minimum resistivity of ≈0.15 Ωcm of a usable silicon ingot 50. When approaching such a low resistivity, for example 0.2 Ωcm, adding only group III element 44 to the silicon melt 48 is not sufficient. In this case, adding additional phosphorus becomes mandatory in order to end up with 100% p-type ingot 50 in conjunction with a high portion of usable material out of this ingot, typically close to 95% of the total ingot.

Figure 4:
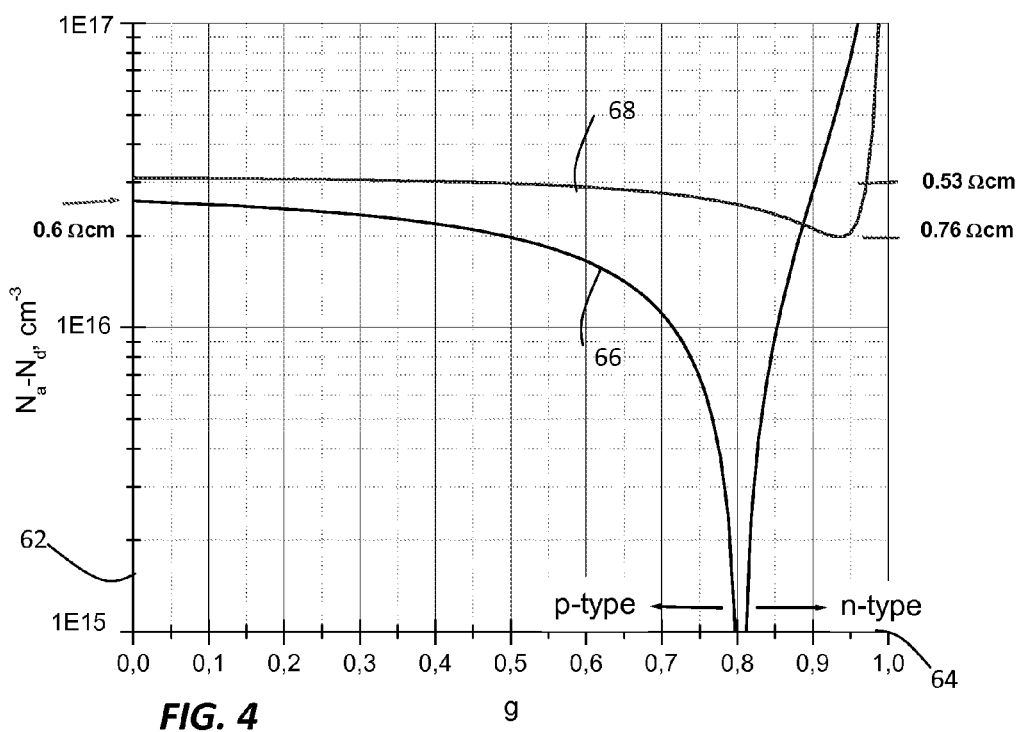
FIG. 4 depicts the axial carrier concentration of an ingot made from compensated UM silicon feedstock material.

In the following FIGS. 4 through 6 and accompanying text appear axial resistivity plots and description of the resulting silicon ingots from the processes of FIGS. 2 and 3. FIG. 4 depicts the axial carrier concentration of an ingot made from compensated UM silicon feedstock material with B concentration $5.0 \times 10^{16}$ cm$^{-3}$ and P concentration $2.4 \times 10^{16}$ cm$^{-3}$ (concentration ratio B/P is close to 2). At the beginning of crystallization, i.e. at the bottom of such an ingot, the resistivity is 0.6 Ωcm which corresponds to an initial majority carrier concentration of $2.6 \times 10^{16}$ cm$^{-3}$. Presented is ACCEPTOR CONCENTRATION minus DONATOR CONCENTRATION along INGOT HEIGHT, with g being the solidified fraction of an ingot: g=0 means bottom of ingot, g=1 means top of ingot.

FIG. 4, therefore, presents a plot 60 of axial resistivity of a silicon ingot when using UM silicon feedstock material. In this case we look at materials that lead to an initial resistivity >0.5 Ωcm. Along ordinate 62 we have resistivity-controlling numbers of electron donors, $N_d$, minus numbers of electron acceptors, $N_a$, as appearing in such a silicon ingot (ranging from $1 \times 10^{15}$ to $1 \times 10^{17}$ per cm$^{-3}$). Along abscissa 64 appears a measure of ingot formation completeness, ranging from 0.0 to 1.0, where 1.0 indicates the complete ingot formation. With an initial resistivity of the silicon ingot of 0.6 Ωcm, line 66 shows that without the disclosed process, at approximately 0.8 completeness $N_d$ essentially equals $N_a$. At this point, the amount of phosphorus in the silicon melt balances the amount of boron. The result of this balance becomes first a p-n junction and then, for the remainder of the silicon ingot, an n-type semiconductor material. Using this ingot would mean at least 20% yield loss of usable p-type material.

In contrast to line 66, line 68 demonstrates the effect of adding an amount of gallium sufficient to counteract the effect of the increasing concentration of phosphorus relative to boron (as shown in FIG. 1). Line 68 shows a slight decrease in resistivity in the silicon ingot due to the addition of gallium. However, the addition of gallium further provides the beneficial effect of maintaining the difference between $N_a$ and $N_d$ almost constant throughout a large portion of the silicon ingot. Thus, essentially until the ingot is approximately at 95% of completion, resistivity ranges between 0.53 Ωcm and 0.76 Ωcm, the silicon remains as p-type semiconductor material, and the p-n junction is, thereby, completely avoided. For the specific feedstock silicon in question, the yield loss on the ingot level is reduced by at least 15%, from at least 20% in the state-of-the art process to approximately 5% in the disclosed process. Another essential advantage is the very tight resistivity range achieved within 95% of usable ingot.

Figure 5:
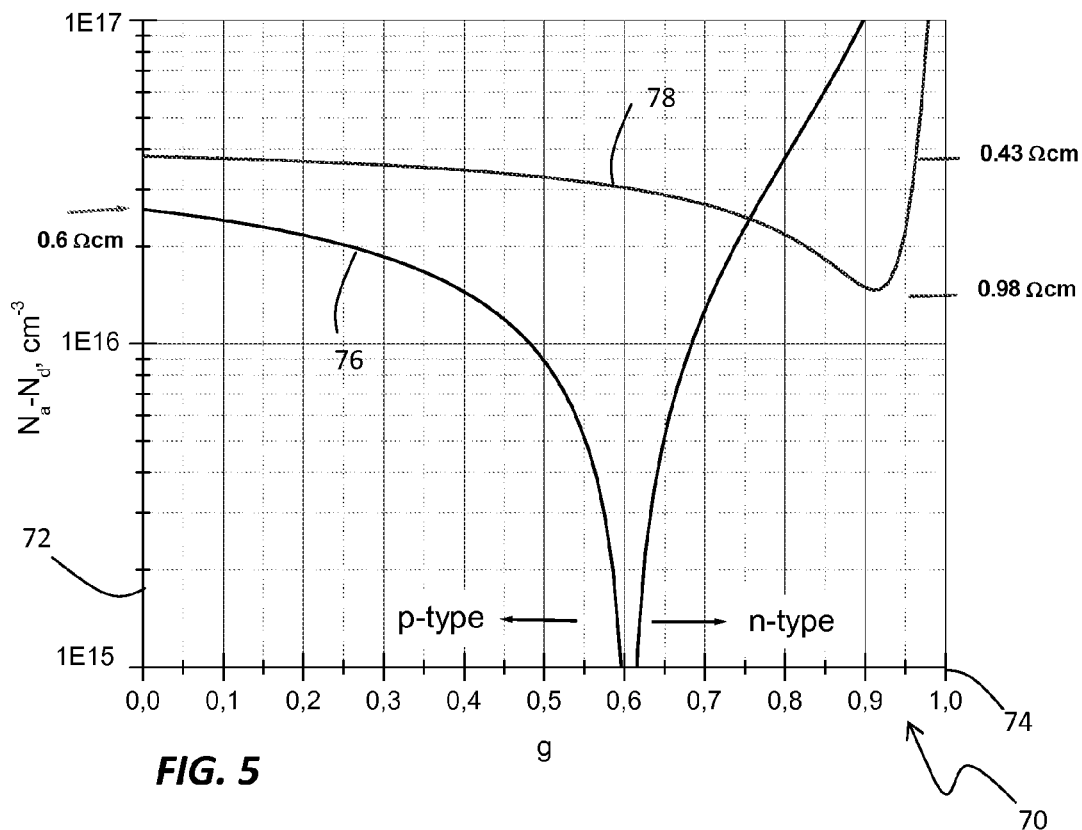
FIG. 5 depicts the axial carrier concentration of an ingot made from differently compensated UM-Si feedstock material.

FIG. 5 depicts the axial carrier concentration of an ingot made from differently compensated UM-Si feedstock material with B concentration $7.6 \times 10^{16}$ cm$^{-3}$ and P concentration $5.0 \times 10^{16}$ cm$^{-3}$ (concentration ratio B/P is close to 1.5). At the beginning of crystallization, i.e. at the bottom of such an ingot, the resistivity is again 0.6 Ωcm which corresponds to an initial majority carrier concentration of $2.6 \times 10^{16}$ cm$^{-3}$. Presented is ACCEPTOR CONCENTRATION minus DONATOR CONCENTRATION along INGOT HEIGHT, with g being the solidified fraction of an ingot: g=0 means bottom of ingot, g=1 means top of ingot. FIG. 5, therefore, presents a plot 70 of axial resistivity of a silicon ingot also using an UM silicon material, as shown in FIG. 2. Ordinate 72 for the values of $N_a$-$N_d$ ranges from $1 \times 10^{15}$ to $1 \times 10^{17}$ per cm$^{-3}$. Along abscissa 74 ingot formation completeness ranges from 0.0 to 1.0. With an initial resistivity of 0.6 Ωcm of the silicon ingot, line 76 shows that without the disclosed process, at approximately 0.6 completeness, $N_d$ essentially equals $N_a$. At this point, the amount of phosphorus in the silicon melt balances the amount of boron. The result of this balance becomes first a p-n junction and then, for the remainder of the silicon ingot, an n-type semiconductor material. Using this ingot would mean at least 40% yield loss of usable p-type material.

In contrast to line 76, line 78 demonstrates the effect of adding an amount of gallium sufficient to counteract the effect of the increasing concentration of phosphorus relative to boron. Line 78 shows a slight decrease in resistivity in the silicon ingot due to the addition of gallium. However, the addition of gallium further provides the beneficial effect of essentially reducing the difference between $N_a$ and $N_d$ throughout the almost entire silicon ingot formation. Thus, essentially until the ingot is approximately at the 0.95 completion point, resistivity ranges between 0.43 Ωcm and 0.98 Ωcm and so the silicon remains usable p-type semiconductor material. The p-n junction is completely FIG. 6 depicts the axial carrier concentration of an ingot made from another compensated UM-Si feedstock material with B concentration $1.86 \times 10^{17}$ cm$^{-3}$ and P concentration $9.0 \times 10^{16}$ cm$^{-3}$ (concentration ratio B/P is close to 2). At the beginning of crystallization, i.e. at the bottom of such an ingot, the resistivity is only 0.2 Ωcm which corresponds to an initial majority carrier concentration of $9.6 \times 10^{16}$ cm$^{-3}$. Presented is ACCEPTOR CONCENTRATION minus DONATOR CONCENTRATION along INGOT HEIGHT, with g being the solidified fraction of an ingot: g=0 means bottom of ingot, g=1 means top of ingot. The p-n junction is completely avoided, and resistivity variation is still very low within 95% of the total ingot. Thus, for the specific feedstock silicon in question, the yield loss on the ingot level is reduced by at least 35%, from at least 40% in the state-of-the art process to approximately 5% in the disclosed process.

Figure 6:
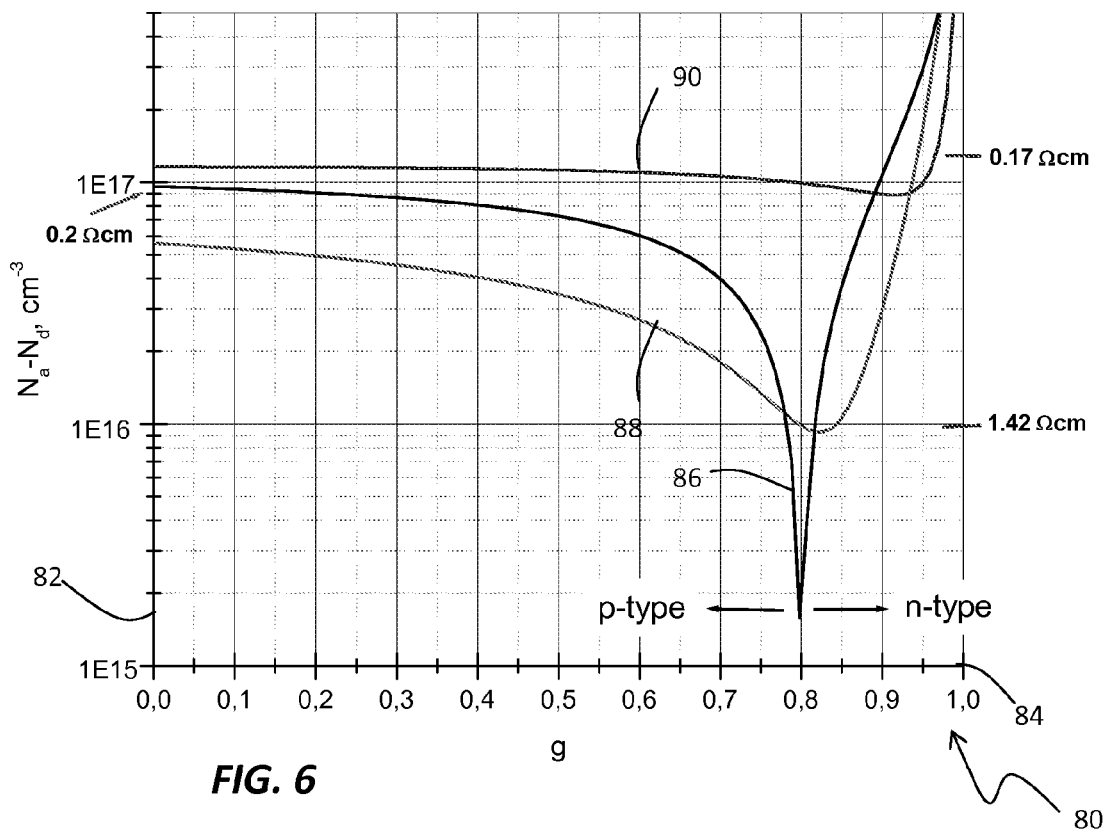
FIG. 6 depicts the axial carrier concentration of an ingot made from another compensated UM-Si feedstock material.

FIG. 6 presents a plot 80 of axial resistivity of a silicon ingot to demonstrate how the present disclosure may yet beneficially affect the resistivity of feedstock material at the edge of the useful resistivity range, as FIG. 3 depicts. Such a process may use a UM silicon feedstock material that, while demonstrating a less desirable resistivity of, e.g., approximately 0.2 Ωcm, possesses the highly desirable feature of significantly lower manufacturing costs.

In plot 80, ordinate 82 for the values of $N_d$-$N_a$ ranges from $1 \times 10^{15}$ to $5 \times 10^{17}$ per cm$^{-3}$. Along abscissa 84 ingot formation completeness ranges from 0.0 to 1.0. With an initial resistivity of the silicon ingot of 0.2 Ωcm, line 86 shows that without the disclosed process, at approximately 0.8 completeness, $N_d$ essentially equals $N_a$. Line 90 demonstrates the effect of adding an amount of gallium sufficient to counteract the effect of the increasing concentration of phosphorus relative to boron. However, almost throughout the whole ingot the resulting resistivity is below the already initially very low resistivity of 0.2 Ωcm (resistivity below this value is less useful). Thus, when using feedstock silicon leading to resistivities at the low end of the useful range, with gallium (or aluminum) alone it is to practically impossible to bring the material into a more useful resistivity range, even though the p-n junction is completely suppressed.

Line 88, however, shows a different result. Line 88 relates to adding also certain amount of phosphorus to the feedstock silicon, in addition to the already added gallium or aluminum. As line 88 shows, the effect is to initially increase the resistivity and avoid the p-n junction. Thus, the silicon remains as p-type semiconductor material, and within approximately 95% of the ingot the resistivity ranges from 0.17 Ωcm to 1.42 Ωcm. Only a very small percentage of this material is in the less useful range <0.2 Ωcm, just opposite to the case of adding only the group III element Ga (or, similarly, Al).

Summarizing, at relatively high ingot resistivity (beyond ≈0.4 Ωcm) an addition of only aluminum or gallium can advantageously counteract compensation of B due to P. These elements of group III of the periodic system have to be added to the feedstock silicon before melt-down for starting crystallization. Contrary to the case of adding boron, when adding Al or Ga an excellent homogenization of the resistivity along the crystallization axis is obtained, in conjunction with avoiding strong resistivity reduction in the early stage of crystallization (which happens if simply adding B instead of Al or Ga). A mixture of Al and Ga is also possible.

At relatively low ingot resistivity (below ≈0.4 Ωcm) one can start adding a combination of Ga and P or, alternatively, of Al and P to advantageously counteract compensation. At very low resistivity (approaching ≈0.2 Ωcm) such a combination of a group III element and P becomes mandatory. Applying certain Ga/P ratio or, alternatively, certain Al/P ratio (whereby Ga can be partially substituted by Al, and vice versa) can now be exploited to make also use of feedstock material with very low resistivity, down to a minimum resistivity of approximately 0.15 Ωcm. Such low-grade material is associated with low production cost.

We have developed a method for controlling resistivity at growing silicon ingots from compensated feedstock silicon material, comprising the steps of:

assessing the concentration of boron and phosphorus that will be initially incorporated into a specific ingot made from compensated feedstock silicon material, determining an appropriate amount of Ga or/and Al (for relatively high resistivity to be expected from above assessment) or, alternatively, determining an appropriate amount of Ga or/and Al and an additional amount of P (for relatively low resistivity to be expected from above assessment), preparing respective feedstock silicon material for being melted to form a silicon melt, by adding predetermined amounts of Ga or/and Al (and likewise P in case of relatively low resistivity to be expected from above assessment), melting and then solidifying the above mixture of feedstock silicon and balanced amounts of Ga or/and Al (and likewise P in case of relatively low resistivity to be expected from above assessment)

by virtue of the adding of the predetermined amount of Ga or/and Al (and likewise P in case of relatively low resistivity to be expected from above assessment) maintaining the homogeneity the resistivity of the specific silicon ingot throughout the respective ingot.

The semiconductor processing features and functions described herein provide for resistivity control in the formation of p-type semiconductor ingot. Although various embodiments which incorporate the teachings of the present disclosure have been shown and described in detail herein, those skilled in the art may readily devise many other varied embodiments that still incorporate these teachings. The foregoing description of the preferred embodiments, therefore, is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein, but is to be accorded the widest scope consistent with the principles and novel features disclosed herein.

What is claimed is:

1. A method for controlling resistivity in the formation of a silicon ingot, comprising the steps of:

preparing a compensated, upgraded metallurgical silicon feedstock for being melted to form a silicon melt, said compensated, upgraded metallurgical silicon feedstock comprising a predominantly p-type semiconductor;

assessing quantitatively the relative concentrations of boron and phosphorus in said compensated, upgraded metallurgical silicon feedstock;

adding to said compensated, upgraded metallurgical silicon feedstock a greater-than-zero quantity of an element from the group consisting of aluminum, gallium, mixtures of aluminum and gallium, or other Group III elements, wherein said quantitatively assessed relative concentrations of boron and phosphorous determine said greater-than-zero quantity;

melting said upgraded metallurgical silicon feedstock and said greater-than-zero quantity of said element to form a molten silicon solution including said greater-than-zero quantity of said element; and performing a directional solidification of said molten silicon solution for forming a silicon ingot and, by virtue of said adding said greater-than-zero quantity of said element, suppressing the transition of said silicon ingot to n-type material by virtue of reducing the effect of differing boron and phosphorous segregation coefficients.

2. The method of claim 1, wherein said preparing step further comprises the step of preparing a compensated, upgraded metallurgical silicon feedstock having an initial resistivity ranging between approximately 0.15 Ωcm and 5.0 Ωcm.

3. The method of claim 1, wherein said assessing step further derives from a determination of the axial resistivity of a compensated, upgraded metallurgical silicon reference sample.

4. The method of claim 1, wherein said preparing step further comprises the step of preparing a compensated, upgraded metallurgical silicon feedstock having a resistivity above approximately 0.5 Ωcm.

5. The method of claim 1, wherein said preparing step further comprises the step of preparing a compensated, upgraded metallurgical silicon feedstock having a resistivity ranging between approximating 0.15 Ωcm and 0.5 Ωcm.

6. The method of claim 1, wherein said adding step further comprises the step of adding to said compensated, upgraded metallurgical silicon feedstock a greater-than-zero quantity of aluminum, wherein the compensated, upgraded metallurgical silicon feedstock having the initial resistivity ranging between approximating 0.15 Ωcm and 0.5 Ωcm.

7. The method of claim 1, wherein said adding further comprises the step of adding to said compensated, upgraded metallurgical silicon feedstock a greater-than-zero quantity of aluminum and a greater-than-zero quantity of phosphorus, wherein the compensated, upgraded metallurgical silicon feedstock having the initial resistivity is less than approximately 0.4 Ωcm.

8. The method of claim 1, wherein said adding step further comprises the step of optionally adding to said compensated, upgraded metallurgical silicon feedstock a combination of aluminum and phosphorus, wherein the compensated, upgraded metallurgical silicon feedstock having the initial resistivity ranges between approximately 0.15 Ωcm and 0.5 Ωcm.

9. The method of claim 1, wherein said adding further comprises the step of adding to said compensated, upgraded metallurgical silicon feedstock a greater-than-zero quantity of gallium.

10. The method of claim 1, wherein said adding step further comprises the step of adding to said compensated, upgraded metallurgical silicon feedstock a greater-than-zero quantity of gallium, wherein the compensated, upgraded metallurgical silicon feedstock having the initial resistivity ranges between approximating 0.15 Ωcm and 0.5 Ωcm.

11. The method of claim 1, wherein adding said further comprises the step of adding to said compensated, upgraded metallurgical silicon feedstock a greater-than-zero quantity of gallium and a greater-than-zero quantity of phosphorus, wherein the compensated, upgraded metallurgical silicon feedstock having the initial resistivity is less than approximately 0.4 Ωcm.

12. The method of claim 1, wherein adding step further comprises the step of optionally adding to said compensated, upgraded metallurgical silicon feedstock a combination of gallium and phosphorus, wherein the compensated, upgraded metallurgical silicon feedstock having the initial resistivity ranges between approximately 0.15 Ωcm and 0.5 Ωcm.

13. The method of claim 1, wherein said adding further comprises the step of adding to said compensated, upgraded metallurgical silicon feedstock a mixture of a greater-than-zero quantity of aluminum and a greater-than-zero quantity of gallium.

14. The method of claim 1, wherein said performing step further comprises the step of yielding a silicon ingot comprising an essentially uniform p-type doping distribution throughout said silicon ingot.

15. The method of claim 1, wherein said performing step further comprises the step of yielding a silicon ingot comprising an essentially 100% p-type material with approximately 95% of said silicon ingot having resistivity ranging between 0.53 Ωcm and 0.76 Ωcm.

16. The method of claim 1, wherein said performing step further comprises the step of yielding a silicon ingot comprising an essentially 100% p-type material with approximately 95% of said silicon ingot having resistivity ranging between 0.43 Ωcm and 0.98 Ωcm.

17. The method of claim 1, wherein said suppressing step further comprises suppressing the transition of said silicon ingot to n-type material to reduce of p-type material by at least ten percent.

\* \* \* \* \*